United States Patent
Grötsch

[11] Patent Number: 6,135,645
[45] Date of Patent: Oct. 24, 2000

[54] LASER DEVICE WITH A SILICONE-ATTACHED ELEMENT

[75] Inventor: Stefan Grötsch, Regensburg, Germany

[73] Assignee: Siemens Aktiengesellschaft, Munich, Germany

[21] Appl. No.: 09/376,944

[22] Filed: Aug. 18, 1999

Related U.S. Application Data

[63] Continuation of application No. PCT/DE98/00489, Feb. 18, 1998.

[30]    Foreign Application Priority Data

Feb. 18, 1997  [DE]  Germany .......................... 197 06 279

[51] Int. Cl.[7] ........................................................ G02B 6/36
[52] U.S. Cl. ................................ 385/92; 385/88; 385/93; 385/94
[58] Field of Search ......................................... 385/88–94

[56]    References Cited

U.S. PATENT DOCUMENTS

| | | | |
|---|---|---|---|
| 5,561,684 | 10/1996 | Martin | 372/107 |
| 5,778,127 | 7/1998 | Gilliland et al. | 385/92 |

FOREIGN PATENT DOCUMENTS

| | | |
|---|---|---|
| 4238434A1 | 10/1993 | Germany . |
| 19511593A1 | 10/1996 | Germany . |
| 57-84189 | 5/1982 | Japan . |
| 2276493A | 9/1994 | United Kingdom . |

OTHER PUBLICATIONS

Japanese Patent Abstract No. 60171780 (Hideya), dated Sep. 5, 1985.
Japanese Patent Abstract No. 56120177 (Yutaka), dated Sep. 21, 1981.
Japanese Patent Abstract No. 03120884 A (Satoshi et al.), dated May 23, 1991.
"Klebstoffe aus Silicon" EPP Baugruppen, Mar. 1995, pp. 36–37.

*Primary Examiner*—Phan T. H. Palmer
*Attorney, Agent, or Firm*—Herbert L. Lerner; Laurence A. Greenberg; Werner H. Stemer

[57]    ABSTRACT

A laser device includes a component emitting laser radiation and at least one element for beam guidance or beam projection, which are disposed in a common housing. The element for beam guidance or beam projection is attached in the housing through the use of silicone.

12 Claims, 1 Drawing Sheet

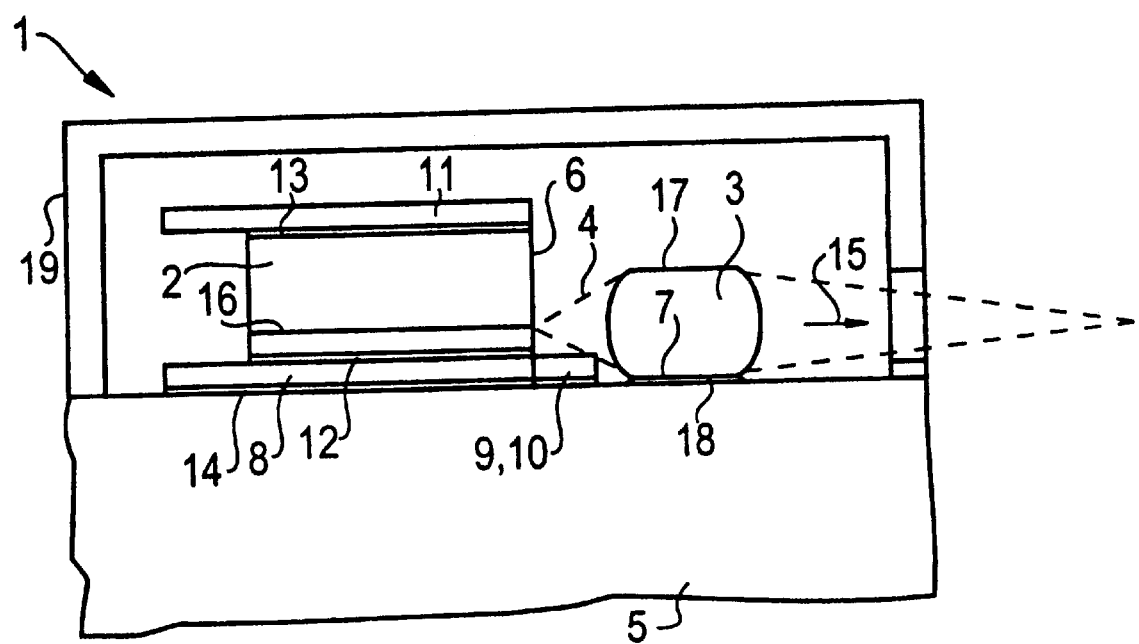

LASER DEVICE WITH A SILICONE-ATTACHED ELEMENT

CROSS-REFERENCE TO RELATED APPLICATION

This application is a continuation of copending International Application No. PCT/DE98/00489, filed Feb. 18, 1998, which designated the United States.

BACKGROUND OF THE INVENTION

FIELD OF THE INVENTION

The invention relates to a laser device, including a component emitting laser radiation and at least one element for beam guidance or beam projection of the laser radiation, which are disposed in a common housing. The invention relates in particular to a laser device having a semiconductor laser chip, in particular a linear array of power semiconductor lasers, and a cylindrical lens for focusing the laser radiation emitted by the semiconductor laser chip. The semiconductor laser chip is attached to a base carrier part and the cylindrical lens is disposed in front of a beam-emergence surface of the semiconductor laser chip.

Heretofore, in devices of that nature, the element for beam guidance (e.g. an optical waveguide) or beam projection (e.g. a lens and/or a mirror) have usually been attached in the housing at very high cost through the use of a soldering glass or a metallic solder.

SUMMARY OF THE INVENTION

It is accordingly an object of the invention to provide a laser device, which overcomes the hereinafore-mentioned disadvantages of the heretofore-known devices of this general type, which allows easier mounting of an element for beam guidance or beam projection and in which a connection device that tolerates high expansions without plastic fatigue and is eminently able to withstand laser irradiation is provided between the element and its mounting surface.

With the foregoing and other objects in view there is provided, in accordance with the invention, a laser device, comprising a common housing; a semiconductor laser chip component disposed in the housing and emitting laser radiation; at least one element disposed in the housing for beam guidance and/or beam projection; and a layer of silicone attaching the at least one element in the housing.

In accordance with another feature of the invention, there is provided a base carrier part, the semiconductor laser chip having a beam-emergence surface, and the semiconductor laser chip and the at least one element being attached to the base carrier part with the at least one element disposed in front of the beam-emergence surface. The semiconductor laser chip may be a linear array of power semiconductor lasers.

In accordance with a further feature of the invention, the at least one element is a cylindrical lens for focusing the laser radiation emitted by the semiconductor laser chip. The cylindrical lens may have a flattened side surface bearing on the base carrier part. The cylindrical lens may be made from a glass fiber. The cylindrical lens may be flattened on two mutually opposite sides.

In accordance with an additional feature of the invention, there is provided an intermediate carrier part disposed between the semiconductor laser chip and the base carrier part, the intermediate carrier part having at least two spacer parts acting as an adjustment for the cylindrical lens. The beam-emergence surface has a given width, and the two spacer parts may be spaced apart by a distance greater than the given width. The spacer parts may have a length fixedly predetermining a focus between the semiconductor laser chip and the cylindrical lens. The intermediate carrier part may include molybdenum, CuW or CuMo.

In a particularly preferred embodiment of the laser device having the semiconductor laser chip as the component emitting laser radiation, the intermediate carrier part is a molybdenum leadframe, which is produced through the use of photo-patterning of a molybdenum layer that has been applied to the base carrier part (e.g. by sputtering, vapor deposition or electroplating) or as a prefabricated part (as a leadframe), and is attached to the base carrier part, for example through the use of a layer of brazing solder. The particular advantage thereof is that mechanical stresses caused by differing thermal expansion of the semiconductor laser chip and of the base carrier part which is used, for example, as a heat sink and is formed, for example, of copper, are to a very large extent compensated for by the intermediate carrier part. That is because molybdenum, due to its high modulus of elasticity, absorbs the mechanical stresses in its elastic expansion range. Naturally, as an alternative to molybdenum, it is also possible to use a different electrically conductive material with a high modulus of elasticity, a high yield stress and an ability to withstand high temperatures. Examples which could be mentioned are W, CuW alloys and CuMo alloys (with a Cu content in each case of between 10 and 20%). All of the above-mentioned materials can be produced both as a foil and as a sputtered, vapor-deposited or electroplated layer and have good thermal conductivity.

Other features which are considered as characteristic for the invention are set forth in the appended claims.

Although the invention is illustrated and described herein as embodied in a laser device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The figure of the drawing is a fragmentary, diagrammatic vertical-sectional view of an exemplary embodiment of the invention.

DESCRIPTION OF THE PREFERRED EMBODIMENTS

Referring now to the single figure of the drawing in detail, there is seen an exemplary embodiment of the laser device of the invention in which an intermediate carrier part 8 is attached to a base carrier part 5 of a housing 19 and a semiconductor laser chip 2 is disposed on the intermediate carrier part 8. The base carrier part 5 is formed, for example, of copper, and the intermediate carrier part 8 is formed, for example, of molybdenum. The semiconductor laser chip 2 is, for example, a linear array of power semiconductor lasers and is formed of $Al_xGa_{1-x}As$ ($0 \leq x \leq 1$). During operation, the power semiconductor laser array or bar emits a multiplicity of individual laser beams 4 that are strip-like in cross section and are disposed next to one another in a straight line. This semiconductor laser chip 2 is joined to the intermediate carrier part 8, for example through the use of a layer 12 of brazing solder (being formed, for example, of Au—Sn solder).

A terminal plate 11, which is provided as a second electric terminal for the semiconductor laser chip 2, is attached to an upper surface of the semiconductor laser chip 2. The terminal plate 11 is preferably made from the same material as the intermediate carrier part 8 and is, for example, likewise attached to the semiconductor laser chip 2 through the use of a layer 13 of brazing solder (being formed, for example, of Au—Sn solder).

In the case of an intermediate carrier part 8 which is produced separately from the base carrier part 5, the intermediate carrier part is preferably likewise attached to the base carrier part 5 through the use of a layer 14 of brazing solder.

Two spacer parts 9, 10 are formed on the intermediate carrier art 8. The spacer parts 9, 10 start from a beam-emergence surface 6 of the semiconductor chip 2 and extend in the direction of a beam-propagation direction 15 of the laser radiation 4. The spacer parts 9, 10 are at a distance from one another which is greater than the width of the beam-emergence surface 6, so that the laser radiation 4 is not impaired by the spacer parts 9, 10.

Furthermore, a cylindrical lens 3, which has flattened side surfaces 7, 17 on opposite sides, is disposed on the base carrier part 5. One of the flattened side surfaces 7 of the cylindrical lens 3 rests on the base carrier part 5, while a curved side surface, which is directed toward the beam-emergence surface 6 of the semiconductor laser chip 2, bears against the two spacer parts 9, 10. The lens 3 is attached to the base carrier part 5 through the use of a layer 18 of silicone. Silicone adhesives are very good at withstanding laser irradiation and tolerate very high expansions without plastic fatigue and without damage.

In order to produce the cylindrical lenses 3 described above, by way of example, relatively long glass fiber pieces are flattened from two opposite sides, for example by grinding, and are then separated into individual cylindrical lenses, for example by sawing.

In order to optically coat beam input and beam output surfaces of the cylindrical lenses 3, the glass-fiber pieces may, for example, be stacked above one another in a rack and provided with a conventional optical coating layer from both sides. The flattened side surfaces ensure that the coated surfaces are not turned during the further handling of the cylindrical lenses 3.

The cylindrical lens 3 is ground in such a manner that its vertex lies accurately at the level of a radiation-emitting area 16 of the semiconductor laser chip 2 which is attached to the intermediate carrier part 8. The focus between the semiconductor laser chip 2 and the cylindrical lens 3 is fixedly predetermined by the spacer parts 9, 10 of the intermediate carrier part 8.

A particular advantage of the laser device 1 according to the invention is the fact that the cylindrical lens 3 can be adjusted with respect to the semiconductor laser chip 2 and then mounted on the base carrier part 5 without operating the semiconductor laser chip 2, and no longer has to be aligned in a number of degrees of freedom.

Naturally, the explanation of the laser device according to the invention, which is provided on the basis of the above-described exemplary embodiment, is not to be understood as limiting the invention to this particular embodiment. Rather, the invention relates to all laser devices of the type mentioned in the introduction such as, for example, solid-state lasers (such as, for example, ruby lasers) that are disposed in a common housing together with an element for beam guidance and/or beam projection.

I claim:

1. A laser device, comprising:

a housing;

a semiconductor laser chip disposed in said housing and emitting laser radiation;

at least one element disposed in said housing for at least one of beam guidance and beam projection; and a layer of silicone attaching said at least one element to said housing.

2. The laser device according to claim 1, including a base carrier part, said semiconductor laser chip having a beam-emergence surface, and said semiconductor laser chip and said at least one element attached to said base carrier part with said at least one element disposed in front of said beam-emergence surface.

3. The laser device according to claim 2, wherein said at least one element is a cylindrical lens for focusing the laser radiation emitted by said semiconductor laser chip.

4. The semiconductor laser device according to claim 3, including an intermediate carrier part disposed between said semiconductor laser chip and said base carrier part, said intermediate carrier part having at least two spacer parts acting as an adjustment for said cylindrical lens.

5. The semiconductor laser device according to claim 4, wherein said beam-emergence surface has a given width, and said two spacer parts are spaced apart by a distance greater than said given width.

6. The semiconductor laser device according to claim 4, wherein said intermediate carrier part includes a material selected from the group consisting of molybdenum, CuW and CuMo.

7. The semiconductor laser device according to claim 4, wherein said spacer parts have a length fixedly predetermining a focus between said semiconductor laser chip and said cylindrical lens.

8. The semiconductor laser device according to claim 3, wherein said cylindrical lens is flattened on two mutually opposite sides.

9. The laser device according to claim 3, wherein said cylindrical lens has a flattened side surface bearing on said base carrier part.

10. The laser device according to claim 3, wherein said cylindrical lens is made from a glass fiber.

11. The laser device according to claim 3, wherein said semiconductor laser chip is a linear array of power semiconductor lasers.

12. The laser device according to claim 1, wherein said layer of silicone adhesively attaches said at least one element to said housing.

* * * * *